(12) United States Patent
Selby et al.

(10) Patent No.: US 8,106,709 B2
(45) Date of Patent: Jan. 31, 2012

(54) PRE AND POST FILTER AUTOMATIC GAIN CONTROL WITH BOUNDED PRE-FILTER GAIN CONTROL

(76) Inventors: Steve Selby, Scarborough (CA); Fung Ling Chiu, Markham (CA); Gary Cheng, Markham (CA)

( * ) Notice: Subject to any disclaimer, the term of this patent is extended or adjusted under 35 U.S.C. 154(b) by 0 days.

(21) Appl. No.: 12/630,272

(22) Filed: Dec. 3, 2009

(65) Prior Publication Data
US 2011/0133840 A1    Jun. 9, 2011

(51) Int. Cl.
*H03G 3/20* (2006.01)
(52) U.S. Cl. .......................................... 330/133; 330/134
(58) Field of Classification Search .................. 330/133, 330/134
See application file for complete search history.

(56) References Cited

U.S. PATENT DOCUMENTS

| | | | |
|---|---|---|---|
| 4,479,254 A | 10/1984 | Craiglow | |
| 6,498,927 B2 * | 12/2002 | Kang et al. | 455/245.2 |
| 6,556,636 B1 | 4/2003 | Takagi | |
| 7,005,922 B2 * | 2/2006 | Oshima et al. | 330/278 |
| 2005/0221779 A1 | 10/2005 | Okanobu | |
| 2009/0298454 A1 * | 12/2009 | Ikeda et al. | 455/234.1 |

FOREIGN PATENT DOCUMENTS

| | | |
|---|---|---|
| EP | 1355419 A2 | 10/2003 |
| EP | 1760879 A2 | 3/2007 |

OTHER PUBLICATIONS

International Search Report for PCT/CA2010/001907 filed Dec. 2, 2010.

* cited by examiner

*Primary Examiner* — Steven J Mottola

(57) ABSTRACT

An electronic circuit includes a first variable gain amplifier for amplifying a signal at an input to provide a first amplified signal; a filter receiving the first amplified signal to provide a filtered signal; a second variable gain amplifier for receiving and amplifying the filtered signal; a second gain control bock, to provide at least one gain control signal derived from the filtered signal, one of the at least one gain control signal to control the gain of the second variable gain amplifier; and a bounding block for receiving one of the at least one gain control signal from the second gain control block, and for generating therefrom a bounded gain control signal to control gain of the first variable gain amplifier.

22 Claims, 7 Drawing Sheets

PRE AND POST FILTER AUTOMATIC GAIN CONTROL WITH BOUNDED PRE-FILTER GAIN CONTROL

FIELD OF THE INVENTION

The present invention relates generally to electronic circuits, and more particularly to electronic circuits including filters with pre and post filter automatic gain control (AGC).

BACKGROUND OF THE INVENTION

AGC circuits are used in a variety of electronic devices and systems. AGC circuits are used to adjust the output of an amplifier to maintain its gain to an appropriate level for input signals within a range.

Narrowband filter circuits use pre and post filter AGC. In this way, the filter input and filter output may be maintained within desired ranges. Pre and post filter AGC gain is typically controlled by the output of the narrowband filter, or independently by signals at the input and output.

Unfortunately, conventional AGC pre and post filter arrangements may not distribute AGC gains pre and post filter optimally.

Accordingly, there is a need for an improved filter AGC arrangement that may more effectively take into account pre filter signal characteristics.

SUMMARY OF THE INVENTION

In accordance with an aspect of the present invention, an electronic circuit includes a first variable gain amplifier, for amplifying a signal at an input to provide a first amplified signal; a filter receiving the first amplified signal, to provide a filtered signal; a second variable gain amplifier, for receiving and amplifying the filtered signal; a second gain control bock, to provide at least one gain control signal derived from the filtered signal, one of the at least one gain control signal to control the gain of the second variable gain amplifier; and a bounding block for receiving one of the at least one gain control signal from the second gain control block, and for generating therefrom a bounded gain control signal to control gain of the first variable gain amplifier.

In accordance with another aspect of the present invention, a method of processing an input signal comprises: amplifying the input signal by a first variable gain amplifier to provide a first amplified signal; filtering the first amplified signal by a filter to provide a filtered signal; amplifying the filtered signal by a second variable gain amplifier to provide an output signal; forming a gain control signal for the second variable gain amplifier, based on an output of the second variable gain amplifier, to provide a gain limited output signal from the second variable gain amplifier; forming a bounding control signal from a signal containing information in the input signal, removed by the filter; forming a first amplifier gain control signal to control gain of the first variable gain amplifier, the first amplifier gain control signal formed from an output of the second variable gain amplifier, but bounded by the bounding control signal to avoid clipping of the first amplifier.

In accordance with yet another aspect of the present invention, an electronic circuit comprises: a plurality of cascaded filters, the first of the plurality of cascaded filters receiving the first amplified signal, and each subsequent one of the plurality of cascaded filters receiving an output of immediately previous one of the plurality of cascaded filters; a variable gain amplifier interposed between an output of each of the cascaded filters and an input of a subsequent one of the plurality of cascaded filters; a first gain control block to provide a gain control signal derived from the first amplified signal; a second gain control bock, to provide at least one gain control signal derived from the filtered signal, one of which controls the gain of the second variable gain amplifier; at least one intermediate gain control block to provide a gain control signal derived from an output of one of the plurality of cascaded filters; a selector for receiving the gain control signal from the first gain control block, the at least one intermediate gain control block, and the at least one gain control signal from the second gain control block, and for providing a selected one of the gain control signal from the first gain control block, at least one intermediate gain control block, and the at least one gain control signal from the second gain control block, to control gain of the first variable gain amplifier.

In accordance with a further aspect of the present invention, there is provided an electronic circuit comprising: a plurality of cascaded filters, the first of the plurality of cascaded filters receiving the first amplified signal, and each subsequent one of the plurality of cascaded filters receiving an output of immediately previous one of the plurality of cascaded filters; a variable gain amplifier interposed between an output of each of the cascaded filters and an input of a subsequent one of the plurality of cascaded filters; a gain control bock and a bounding block, each associated with each one of the variable gain amplifiers, the gain control block to provide a gain control signal derived an output of a downstream one of the plurality of cascaded filters to control the gain of the associated variable gain amplifier, and each bounding block for receiving the gain control signal from its associated gain control block and for generating therefrom a bounded gain control signal to control gain of its associated variable gain amplifier.

Other aspects and features of the present invention will become apparent to those of ordinary skill in the art upon review of the following description of specific embodiments of the invention in conjunction with the accompanying figures.

BRIEF DESCRIPTION OF THE DRAWINGS

In the figures which illustrate by way of example only, embodiments of the present invention.

DETAILED DESCRIPTION

Figure 1A:
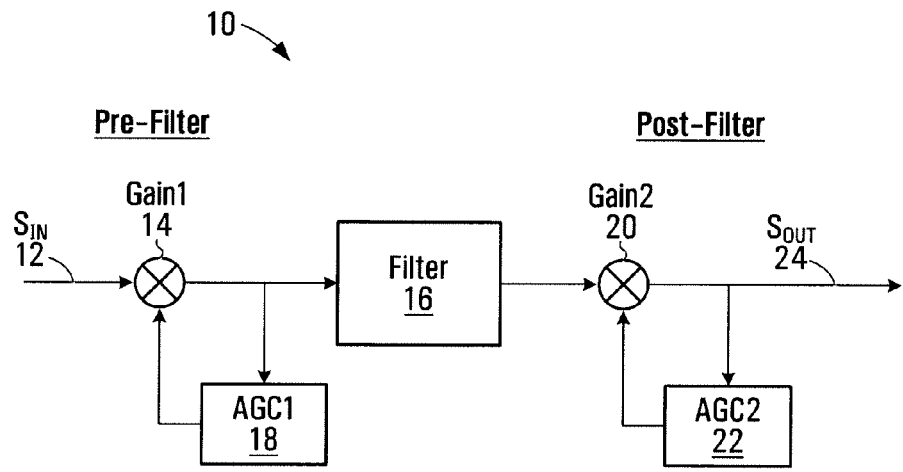
FIG. 1A is a simplified schematic block diagram of an electronic circuit including a filter with pre and post filter AGC.

FIG. 1A schematically illustrates an electronic circuit 10, including a conventional filter 16 with pre and post filter AGC. As illustrated, a signal $S_{in}$ at input 12 to a filter 16 is amplified by a variable gain amplifier 14, whose gain is controlled by AGC block 18. The output of filter 16 is similarly amplified by variable gain amplifier 20 under control of AGC block 22, to provide an output $S_{out}$.

AGC block 18 is provided with the output of variable gain amplifier 14 and accordingly provides a control signal to adjust the gain of variable gain amplifier 14, based on this output to provide a bounded input to filter 16. Likewise AGC block 22 is provided with the output of variable gain amplifier 20 and accordingly adjusts the gain of amplifier 20 to provide a bounded output signal, $S_{out}$ at output 24. The overall amplitude of $S_{out}$ is thus the result of gain of amplifier 14, amplifier 20 and filter 16.

In the depicted embodiment, filter 16 is a narrowband band-pass filter. Amplifier 20 may similar be a narrow-band amplifier. Amplifier 14, however, typically amplifies the narrowband, as well as adjacent channels. As will become apparent, filter 16 could alternatively be a low-pass, high-pass or other filter.

AGC blocks 18, 22 may be formed as a combination of conventional passive and/or active components, arranged to produce control signals to maintain output of a controlled variable gain amplifier within a bounded range. AGC blocks 18,22 may, for example, be formed to exercise proportional-integral-derivative (PID) control over amplifiers 14 and 20. Notably, AGC blocks 18 and 22 each provide an independent gain control output, controlling the gains of amplifiers 14 and 20, respectively. This approach maximizes the dynamic range of amplifier 14. However, amplifier 14 may be contributing too great a portion of the gain resulting in $S_{out}$. Moreover, the gain of amplifier 14 will react to perturbations in the energy of adjacent channels in $S_{in}$. This may be undesirable or unnecessary.

Figure 1B:
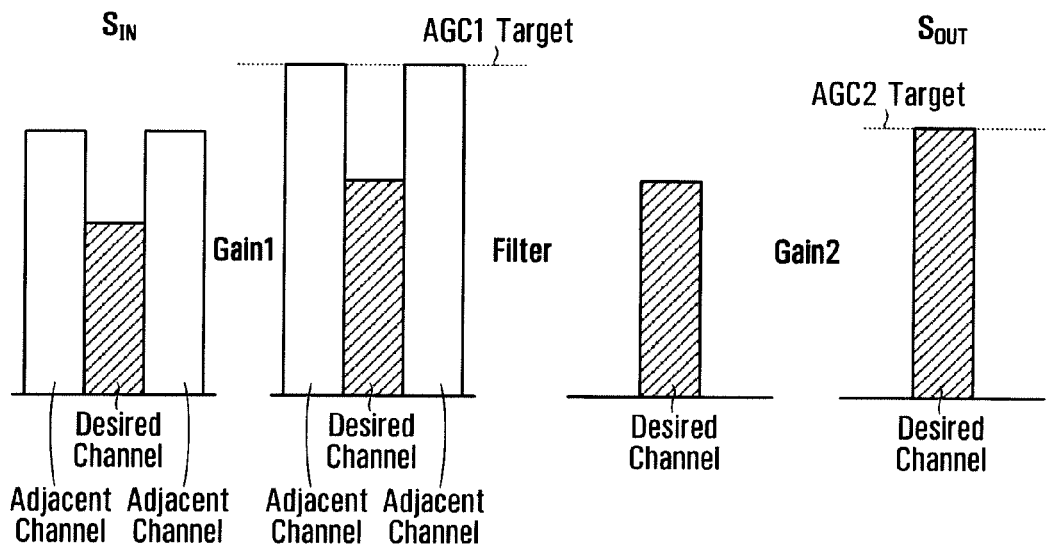
FIG. 1B is a graph that illustrates filtering of signals by the filter of FIG. 1A.

FIG. 1B illustrates filtering of a weak desired channel, flanked by strong adjacent channels, filtered by circuit 10. Specifically, the input signal at input 12, the output of amplifier 14, the output of filter 16, and the output of amplifier 20 are illustrated. As the gain of amplifier 14 is limited by AGC block 18 which receives an unfiltered amplified version of the signal $S_{in}$, perturbations in the energy in the adjacent channels in $S_{in}$ will affect the gain of amplifier 14.

Figure 2A:
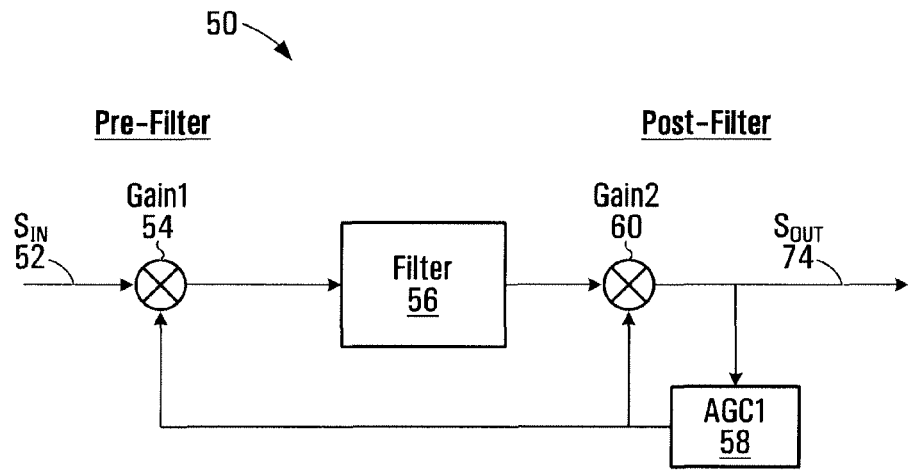
FIG. 2A is a simplified schematic block diagram of an electronic circuit including a filter with pre and post filter AGC.

FIG. 2A similarly illustrates a further conventional filter 56 with pre and post filter AGC. As illustrated, a signal $S_{in}$ at input 52 is amplified by variable gain amplifier 54, and provided to a filter 56. The output of filter 56 is similarly amplified by variable gain amplifier 60 to provide an output signal $S_{out}$ at output 74.

A single AGC block 58 provides one or more gain control signals to control both variable gain amplifiers 54 and 60 Automatic gain control block 58 is provided with the output of variable gain amplifier 60 and accordingly adjusts the gains of both variable gain amplifiers 54 and 60 to provide a bounded output signal $S_{out}$. Again, the overall amplitude $S_{out}$ is thus the result of combined gains of amplifier 54 and amplifier 60.

Filter 56 (like filter 16) may be a narrow band-pass filter. Amplifier 60 amplifies the narrow band. Amplifier 54 amplifies the band, as well as adjacent channels.

Figure 2B:
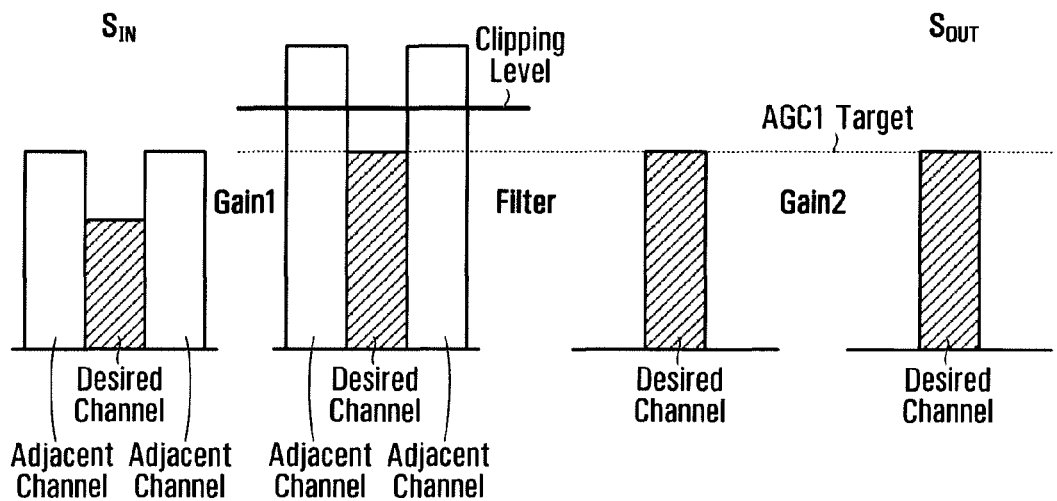
FIG. 2B is a graph that illustrates filtering of signals by the filter of FIG. 2A.

Notably, only a single AGC block 58 is used to provide a single gain control signal to control the gain of both amplifiers. Conveniently, this approach reduces or minimizes the gain of amplifier 54. FIG. 2B illustrates filtering of a weak desired channel, flanked by strong adjacent channels, filtered by circuit 50. Input signal at input 52, the output of amplifier 54, the output of filter 56, and the output of amplifier 60 are illustrated. As should be apparent, AGC block 58 does not receive components of signal $S_{in}$, filtered by filter 56. As such, the gain of amplifier 54 is not affected by perturbations in the energy of adjacent channels in $S_{in}$, as the adjacent channels are filtered. However, strong adjacent channels may cause clipping or distortion of amplifier 54 or filter 56.

Figure 3A:
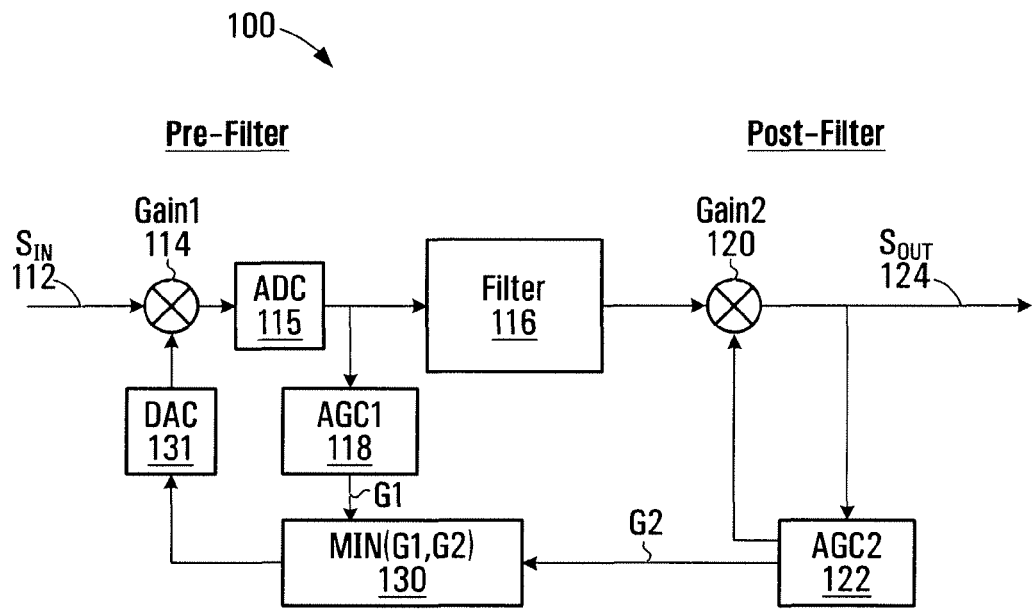
FIG. 3A is a simplified schematic block diagram of an electronic circuit including a filter with pre and post filter AGC, exemplary of an embodiment of the present invention.

To mitigate some of the disadvantages of circuits 10 and 50, FIG. 3A illustrates an electronic circuit 100 including a filter 116 with pre and post filter AGC, exemplary of an embodiment of the present invention.

Circuit 100 may be a digital circuit, or a mixed analog/digital circuit, and may thus be formed using standard digital signal processing (DSP) techniques and/or analog circuit design techniques. Circuit 100 may be part of a larger circuit, such as a video or audio amplifier, a television or radio receiver or transmitter, or the like.

As illustrated, a signal $S_{in}$ at input 112 to a filter 116 is amplified by variable gain amplifier 114, whose gain is controlled by a AGC block 122. The output of filter 116 is similarly amplified by variable gain amplifier 120 under control of AGC block 122, to provide an output $S_{out}$ at output 124.

In the depicted embodiment, variable gain amplifier 114 is formed as analog circuits, while filter 116 and variable gain amplifier 120 is formed as a digital amplifier. The output of variable gain amplifier 114 is converted to a digital signal by analog to digital converter (ADC) 115. The digital output of ADC 115 is passed to filter 116.

Filter 116 (like filters 16 and 56) is again a narrowband filter. Variable gain amplifier 114 amplifies the narrow band, as well as any adjacent channels. Variable gain amplifier 120 amplifies the narrowband. In alternate embodiments, filter 116 can take any suitable form: a low-pass filter, a high-pass filter, a band-pass filter, a notch filter, or the like. Typically, filter 116 filters energy in an input signal to generate its output. Filter 116 may be digital or analog. In the depicted embodiment, filter 116 is a digital filter, that may be formed as a FIR/IIR filter. Amplifier 120 may amplify the resulting band.

AGC block 122 is provided with the output of variable gain amplifier 120 and forms at least one gain control signal. In the depicted embodiment, AGC block 122 is a digital AGC block, and provides two digital AGC control signals at its outputs, used to control the gain of amplifiers 120 and 114 as described below.

Specifically, one of the gain control signals formed by AGC block 122 is used to control the gain of variable gain amplifier 120. This signal accordingly controls the gain of variable gain amplifier 120 to provide a bounded output signal, $S_{out}$.

At least one of the gain control signals formed, G2, at AGC block 122 is provided to the input of selector 130 to control the gain of amplifier 114, as further described below. AGC block 122 may provide the same signal to variable gain amplifier 120 and selector 130. Alternatively, two different signals—one to control amplifier 114 and the other to control amplifier 120, may be formed by second AGC block 122.

First AGC block 118 further forms an AGC control output G1 from the output of variable gain amplifier 114. Again, AGC block 118 may operate in the digital domain, producing a digital output signal from a digital input signal provided by ADC 115. The AGC control signal from AGC control block 118 is provided to a second input of selector 130.

AGC blocks 118, 122 may be formed as a combination of conventional passive and/or active components, arranged to produce control signals to maintain output of a controlled variable gain amplifier within a bounded range. AGC blocks 118, 122 may, for example, be formed to exercise proportional-integral-derivative (PID) control over variable gain amplifiers 114 and 120. As will be appreciated, AGC blocks 118, 122 may each have different characteristics. For example, and as will become apparent AGC block 122 may provide two distinct control outputs based on its input. AGC block 122 may react more quickly than block 118

Depending upon the applications of the system, AGC block 118 and AGC block 122 may be formed in any number of ways, known to those of ordinary skill. As noted AGC blocks 118, 122 are digital AGC blocks. As will be appreciated, with minor modification either or both of AGC blocks 118 could be formed as analog blocks.

Figure 4:
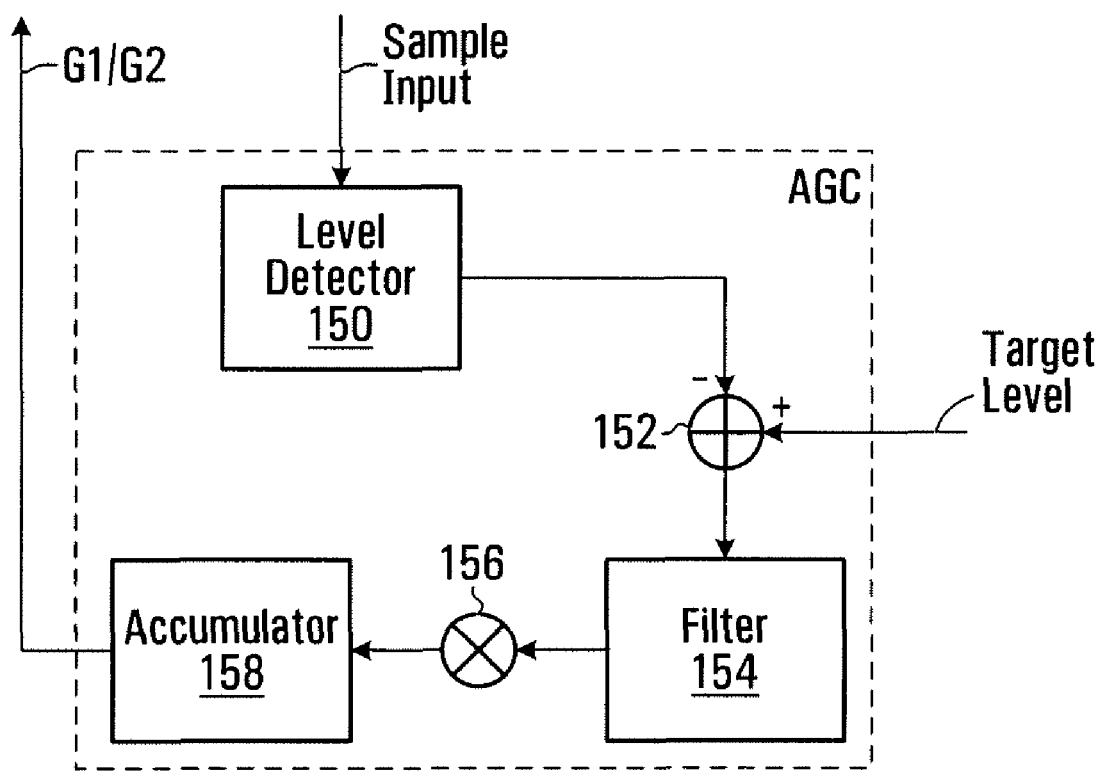
FIG. 4 is a simplified schematic diagram of an AGC block of the electronic circuit of FIG. 3A.

In general, an AGC block, like AGC blocks 118, 122 may include a level detector 150, a summer 152, a filter 154, a gain block 156, and an accumulator 158 as depicted in FIG. 4. Level detector 150 may, for example, detect the peak signal level, average signal level, rms signal level or the like. Summer 152 subtracts the current signal level, as sampled at an input, from a target level. The target level may be provided externally from a digital input, contained for example in a register, dip switch or the like. Alternatively, the target level may be a static parameter of AGC block 118/122.

Level detector 150, summer 152, filter 154, gain block 156 and accumulator 158 provide a proportional-integral-derivative (PID) control loop, so that the output of AGC blocks 118,120 provides a gain signal that causes the sampled input to approach the target level, or a multiple thereof. As AGC block 122 provides two distinct outputs, AGC block 122 may further include two detectors, summers, filters, gain blocks and accumulators as described. Alternatively, such components may be shared where appropriate across two signal paths to provide two separate gain control outputs.

Now, selector 130 selects which of the provided gain control signals is used to control the gain of amplifier 114—the gain control signal G2 formed by AGC block 122, or the gain control signal G1 formed by AGC block 118. In the depicted embodiment, selector 130 may select the minimum of the output of AGC block 118 and AGC block 122 to control the gain of amplifier 114.

As amplifier 114 is an analog amplifier, the output of selector 130 may further be converted from a digital signal to an analog signal by digital to analog converter 131.

By selecting the minimum of two gain control signals G1 and G2, the gain of amplifier 114 is kept relatively low while providing a bounded output signal $S_{out}$. Conveniently, this may avoid clipping of the input signal by variable gain amplifier 114. Put another way—one gain control signal (G2) primarily regulates the gain of variable gain amplifier 114. Gain control signals G1 derived from the output of variable gain amplifier 114, acts as a bounding signal for G2 and limits the gain of variable gain amplifier 114 based on information unseen by AGC block 122 (i.e. based on a signal containing information filtered by filters 116). Selector 130 effectively acts as a bounding block: selector 130 bounds G2, and provides a bounded gain control signal that is the lesser of G1 and G2 to amplifier 114.

That is, the gain control signal that controls the gain of amplifier 114 is bounded by a gain control signal G1 derived from a signal pre-filter 116, so as to (i) reduce the contribution of the gain of variable gain amplifier 114 to the output signal $S_{out}$, while providing a bounded output by amplifier 120, and (ii) avoid clipping of amplifier 114.

In yet another alternative embodiment, selector 130 may alternatively provide the minimum output of its input, or some further internal (or externally provided) minimum value to bound the provided gain control signal. In this way, the control signal provided amplifier 114 may be limited to some minimum value, regardless of the gain control values G1/G2 that might otherwise be calculated by AGC blocks 118,122.

In one embodiment, circuit 100 can be formed as part of an RF television tuner. As such amplifier 114 may be a low noise amplifier in the RF tuner. AGC block 118 may be a low distortion, low noise gain control block designed for a television RF tuner. Filter 116 may be a SAW filter function (formed as a SAW board component or a digital FIR/IIR filter), and amplifier 120 may a post filter amplifier, to set the output level to a specified target. AGC block 122 may be a digital gain control block which regulates the level of desired channel energy (CVBS, Audio SIF/Mono/Stereo, Digital Modulated Signals). AGC block 122 can be implemented with a linear or a shaped non-linear gain transfer function.

Figure 3B:
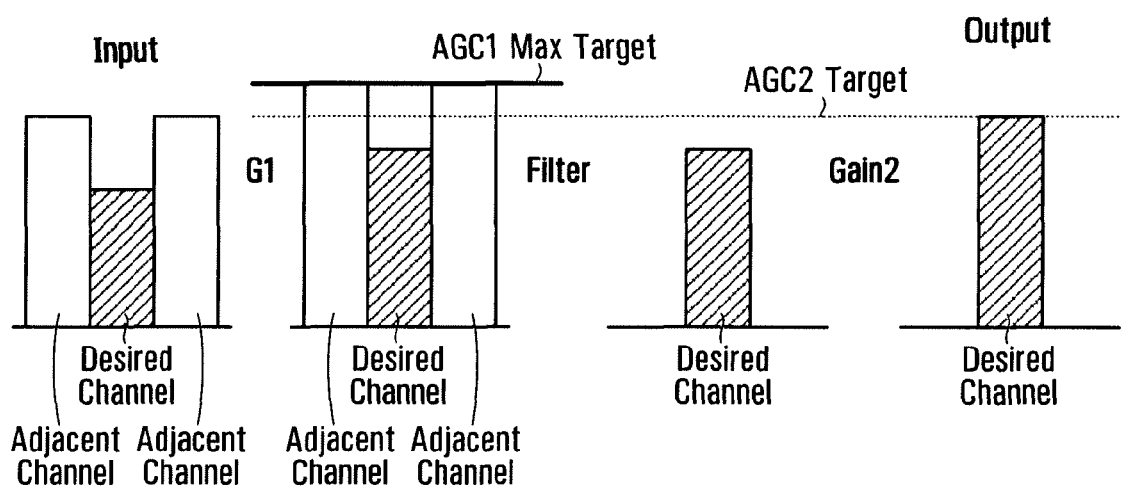
FIG. 3B is a graph that illustrates filtering of signals by the filter of FIG. 3A.

FIG. 3B illustrates filtering of a weak desired channel, flanked by strong adjacent channels, filtered by circuit 100 of FIG. 3A. Specifically, the input signal at 112, the output of variable gain amplifier 114, the output of filter 116, and the output of amplifier 120 are illustrated. As the gain of amplifier 114 is limited by AGC block 118 by the lesser of the AGC control signal formed pre and post filter 116, perturbations in the energy in the adjacent channels in $S_{in}$ will affect the gain of amplifier 114, to avoid clipping by variable gain amplifier 114. In the absence of perturbations in the input signal, the gain of variable gain amplifier 114 is set by AGC block 122 at the minimum level to satisfy a desired output level of signal $S_{out}$.

Figure 5:
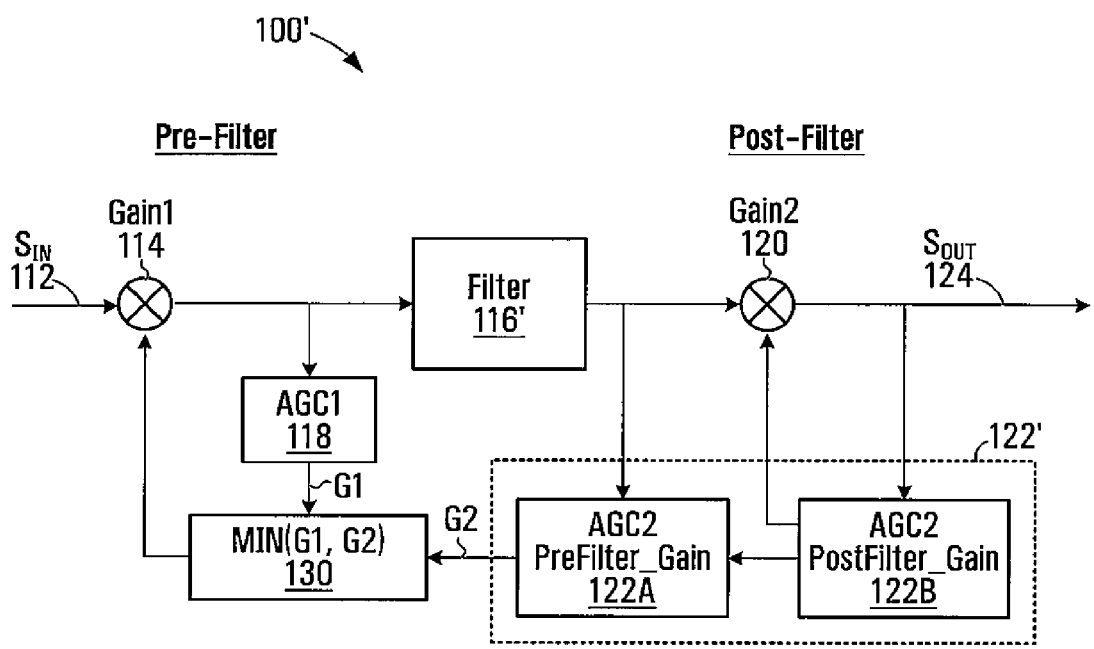
FIG. 5 is a simplified schematic block diagram of an electronic circuit including a filter with pre and post filter AGC, exemplary of another embodiment of the present invention.

In an alternate embodiment, depicted in FIG. 5, circuit 100' is a slightly modified version of circuit 100. For simplicity ADCs and DACs are not specifically illustrated. In this embodiment, two separate post filter values are formed—using sub blocks 122A and 122B of block 122', in place of block 122 in FIG. 3A. Sub-block 122B calculates a post filter gain control signal from a signal at the output of amplifier 120 to control the gain of variable gain of amplifier 120. Sub-block 122A further provides a pre-filter gain control signal from the input to variable gain amplifier 120 to be provided to selector 130.

As will be appreciated, the pre-filter gain control signal calculated by AGC sub-block 122a could be formed from the post filter gain control signal generated by sub-block 122b, simply by processing the signal post amplifier 120 to reduce or remove the effects of amplifier 120. This would obviate the need for additionally sampling the input to amplifier 120.

Figure 6:
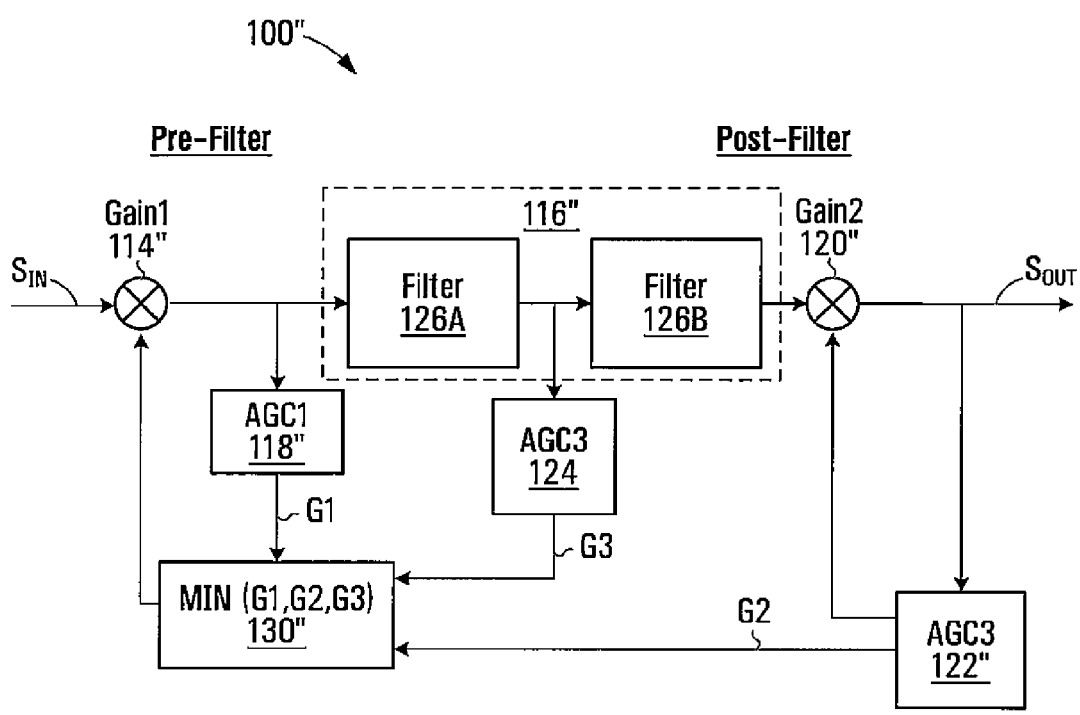
FIG. 6 is a simplified schematic block diagram of an electronic circuit including a filter with pre and post filter AGC, exemplary of another embodiment of the present invention.

As may now be appreciated, one or more signals containing information filtered by filter may be used to limit pre-filter gain. For example, FIG. 6 illustrates a pre and post filter AGC circuit 100" that employs signal taken pre-filter 116", from within filter 116" and post filter 116" to limit the gain of a pre-filter variable gain amplifier 114".

As illustrated, an input signal $S_{in}$ is provided to a variable gain amplifier 114". The output of variable gain amplifier 114" is provided to filter 116", which may be modelled as two or more series filters 126A and 126B. The output of one of the filters 126A is provided to filter 126B. The output of filter 126B is provided to a variable gain amplifier 120". First and second AGC blocks 118" and 122" respectively form gain control signal from signal sampled pre and post filters 116" (126A/126B).

AGC block 118" has a structure similar to AGC block 118 (FIG. 3), and each provide a single gain control value at their output. AGC block 122" may have a structure similar to AGC block 122/122' (FIGS. 3, 5), and provides two distinct gain control outputs from the output of variable gain amplifier 120": one to control variable gain amplifier 120", and the other to be provided to a bounding block, in the form of selector 130".

A third AGC block 124" has a structure similar to AGC block 118" and provides a further single gain control signal G3 at its output, based on the output of the first of the series filters, filter 126A. As will be appreciated, the signal at the output of filter 126A contains information that will be filtered by filter 126B, before forming an output signal.

Now, one of the gain control signals formed by AGC block 122" is used to control the gain of variable gain amplifier 120". This signal accordingly controls the gain of variable gain amplifier 120" to provide a bounded output signal, $S_{out}$.

At least one of the gain control signals G2, formed at AGC block 122" is provided to an input of selector 130" to control amplifier 114", as further described below.

AGC block 118" further forms an AGC control output G1 from the output of variable gain amplifier 114".

G1, G2, and G3 are provided to separate inputs of selector 130".

Selector 130" selects which of the three provided gain control signals is used to control the gain of amplifier 114"—the gain control signal G1 formed by AGC block 118", the gain control signal G3 formed by AGC block 124", or the gain control signal G2 formed by AGC block 122".

In the depicted embodiment, circuit 100" is again a mixed digital/analog circuit. Amplifier 114" is analog, while filters 116", amplifier 120", and AGC blocks 118",122" and 124" and selector 130" are digital. Again, DACs and ADCs are not illustrated for simplicity. And again, circuit 100" could similarly be implemented using different combinations of analog and digital blocks, or entirely as digital or analog circuits.

In the depicted embodiment, selector 130" may select the minimum of the output of AGC block 118", AGC block 122", and AGC block 124" to control the gain of amplifier 114".

Conveniently, by selecting the minimum of three gain control signals G1, G2, and G3, the gain of amplifier 114" is again kept relatively low while providing a bounded output signal $S_{out}$ at the output of amplifier 120". Conveniently, this may avoid clipping of the input signal by variable gain amplifier 114". Put another way—the gain control signal that controls the gain of amplifier 114" is derived from the signal as filtered by filter 116" and the output signal $S_{out}$ as amplified by amplifier 120", so as to (i) reduce the contribution of the gain of variable gain amplifier 114" to the output signal $S_{out}$, while providing a bounded output by amplifier 120", and (ii) avoid clipping of amplifier 114" and/or filter 116".

Selector 130" again effectively acts as a bounding block: selector 130" bounds post filter gain control signal G2 and provides a bounded gain control signal that is the lesser of G1, G2 and G3 to control the gain of pre-filter variable gain amplifier 114".

As should now again be appreciated, in circuit 100" of FIG. 6, one gain control signal (G2) primarily regulates the gain of amplifier 114". Gain control signals G1, G3 derived from the outputs of amplifier 114" and filter 126A, respectively, bound the gain of amplifier 114" based on information unseen by AGC block 122" (i.e. from a signal containing information filtered by filters 126A/126B).

Figure 7:
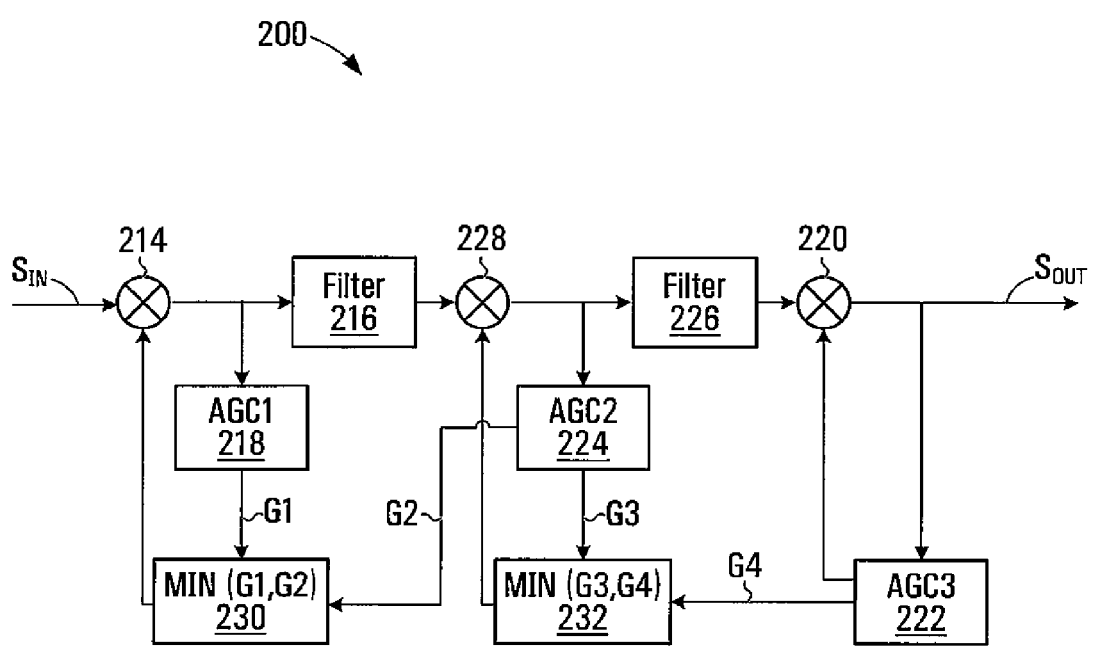
FIG. 7 is a simplified schematic block diagram of an electronic circuit including multiple cascaded filters with pre and post filter AGC, exemplary of another embodiment of the present invention

As may now be appreciated, multiple filters including pre and post filter AGC as described above may also be cascaded. To this end, FIG. 7 illustrates an electronic AGC circuit 200 including two cascaded filters having pre and post filter AGC substantially as described above.

As illustrated, an input signal $S_{in}$ is provided to a variable gain amplifier 214. The output of variable gain amplifier 214 is provided to filter 216. The output of filter 216 is provided to a variable gain amplifier 228. The output of variable gain amplifier 228 is provided to filter 226. The output of filter 226 is provided to a further variable gain amplifier 220. AGC blocks 218, and 222 respectively form gain control signal from signal sampled pre and post filters 216/226.

A further AGC block 224 forms a gain control signal, post filter 216 (and amplifier 228), but pre-filter 226, from a signal containing information not seen by AGC block 222.

AGC block 218 has structure similar to AGC block 118 (FIG. 3), and provides a single gain control value at its output.

AGC block 222 may have structure similar to AGC block 122/122' (FIGS. 3, 5), and provides two distinct gain control outputs from the output of variable gain amplifier 220: one to control variable gain amplifier 220, and the other to be provided to an upstream selector 232, acting as a bounding block.

AGC block 224 also has structure similar to AGC block 122/122' and provides two gain control signals: one to control variable gain amplifier 228, and the other to be provided to an upstream selector 230, acting as a bounding block.

Now, one of the gain control signals formed by AGC block 222 is used to control the gain of variable gain amplifier 220. This signal accordingly controls the gain of variable gain amplifier 220 to provide a bounded output signal, $S_{out}$. At least one of the gain control signals, G4, formed at AGC block 222 is provided to the input of selector 232 to control amplifier 228, as further described below.

Similarly, one of the gain control signals, G3, formed by AGC block 224 is used to bound the gain of variable gain amplifier 228, the other G2, is used to control the gain of amplifier 214. This signal G2 is thus provided to the input of selector 230 to control amplifier 214.

AGC block 218 further forms an AGC control output G1 from the output of variable gain amplifier 214.

Selector 230 selects which of the two provided gain control signals is used to control the gain of amplifier 214—the gain control signal G1 formed by AGC block 218 or the gain control signal G2 formed by AGC block 224.

Selector 232 likewise selects which of the two provided gain control signals, G3, G4, is used to control the gain of amplifier 228—the gain control signal G3 formed by AGC block 224 or the gain control signal G4 formed by AGC block 222.

Selectors 230/232 again effectively act as a bounding blocks: selector 230 bounds G2 and provides a bounded gain control signal that is the lesser of G1, and G2 to control the gain of amplifier 214; selector 232 bounds G4 and provides a bounded gain control signal that is the lesser of G3, and G4 to control the gain of amplifier 228.

In the depicted embodiment, selector 230 may select the minimum of the output of AGC block 218 and AGC block 224 to control the gain of amplifier 214. Likewise, selector 232 may select the minimum of the output of AGC block 222 and AGC block 224 to control the gain of amplifier 228.

Again, in the depicted embodiment, circuit 200 is a mixed digital/analog circuit. Amplifier 214 is analog, while filters 216, 226, amplifier 220, and AGC blocks 218, 222 and 224 and selectors 230 and 232 are digital. DACs and ADCs are not illustrated for simplicity. Again, circuit 200 could similarly be implemented using different combinations of analog and digital blocks, or entirely as digital or analog circuits.

As should now again be appreciated, in circuit 200, a downstream, post-filter gain control signal (G2/G4) primarily regulates the gain of an upstream, pre-filter variable gain amplifier 214/228. Gain control signals G1, G3 derived from the outputs of amplifier 214, 228 respectively, bound the gain of amplifier 214, 228 based on information unseen by AGC blocks 224, 222 (i.e. from a signal containing information filtered by filters 216,226).

Put another way—the gain control signal G2, G4 that controls the gain of a variable gain amplifier 214/228 is derived from a downstream filtered signal, as filtered by filter 216/226, while being bounded by an AGC signal G1, G3. AGC signal G1, G3 is formed from a signal containing information that is filtered by one or more downstream filters. Conveniently this may avoid clipping/distortion of amplifiers 214, 228 and filters 216, 226.

As will be appreciated, circuit 200 could easily be modified to include more than two cascaded filters like filters 216, 226 with the input of each cascaded filter being provided by a previous one of the cascaded filters, amplified by an interposed amplifier (e.g. amplifier 228). Intermediate gain control signals may be formed from the output of one or more of the cascaded filters to limit gain the gain of up-stream amplifier(s) based on information unseen by downstream AGC blocks (i.e. information filtered by the cascaded filters).

As will be appreciated, bounding blocks have been realized as selectors 130,130",230 and 232. Bounding blocks, may however be formed in any number of ways. For example, a bounding block may formed as a control block that receives a signal to be bounded (e.g. G2) and one or more control signals increases or decreases G2 so that a controlled variable gain amplifier performs as required. The control signals could be derived in an AGC block like block 118. Other suitable of forming a bounding block will be readily appreciated by those of ordinary skill.

As will also be appreciated the circuits depicted herein may be formed as single integrated circuits using suitable application specific integrated circuit (ASIC) design and fabrication tools. To that end, circuits depicted herein may be described using a conventional hardware descriptor language (HDL), such as Verilog, VHDL, or the like stored on a computer readable medium.

Of course, the above described embodiments are intended to be illustrative only and in no way limiting. The described embodiments of carrying out the invention are susceptible to many modifications of form, arrangement of parts, details and order of operation. The invention, rather, is intended to encompass all such modification within its scope, as defined by the claims.

What is claimed is:

1. An electronic circuit comprising:
    a first variable gain amplifier, for amplifying a signal at an input to provide a first amplified signal;
    a first gain control block to provide a first gain control signal;
    a filter receiving said first amplified signal, to provide a filtered signal;
    a second variable gain amplifier, for receiving and amplifying said filtered signal;
    a second gain control bock, to provide at least one second gain control signal derived from said filtered signal, one of said at least one second gain control signal to control the gain of said second variable gain amplifier; and
    a bounding block for receiving one of said at least one second gain control signal from said second gain control block and said first gain control signal, and for generating therefrom a bounded gain control signal to control gain of said first variable gain amplifier by limiting said at least one second gain control signal from said second gain control block, in dependence on a value of said first gain control signal.

2. The electronic circuit of claim 1, wherein said first first gain control signal is derived from said first amplified signal.

3. The electronic circuit of claim 2, wherein said bounding block forms said bounded gain control as the lesser of said at least one second gain control signal derived from said filtered signal and said first gain control signal from said first gain control block.

4. The electronic circuit of claim 1, wherein said signal at said input is an analog signal, wherein said first variable gain amplifier is an analog amplifier, and further comprising an analog to digital converter for converting an output of said first variable gain amplifier into said filtered signal.

5. The electronic circuit of claim 1, wherein said second gain control block provides two gain control signals.

6. The electronic circuit of claim 5, wherein said second gain control block further receives said filtered signal.

7. The electronic circuit of claim 2, further comprising a third gain control block to provide a third gain control signal derived from a signal containing information that has been filtered from said filtered signal.

8. The electronic circuit of claim 7, wherein said bounding block forms said bounded gain control as the lesser of said at least one second gain control signal from said second gain control block, said first gain control signal from said first gain control block, and said third gain control signal.

9. An electronic circuit comprising:
    a first variable gain amplifier for amplifying a signal at an input, to provide a first amplified signal;
    a filter, receiving said first amplified signal, to provide a filtered signal;
    a second variable gain amplifier, for receiving and amplifying said filtered signal;
    a first gain control block to provide a gain control signal derived from said first amplified signal;
    a second gain control block, to provide at least one gain control signal derived from said filtered signal, one of said at least one gain control signals to control the gain of said second variable gain amplifier;
    a selector for receiving said gain control signal from said first gain control block, and at least one gain control signal from said second gain control block, and for providing a selected one of said gain control signal from said first gain control block, and said at least one gain control signal from said second gain control block, to control gain of said first variable gain amplifier.

10. The electronic circuit of claim 9, wherein said selector provides the smaller of said gain control signal from said first gain control block, and said at least one gain control signal from said second gain control block to control gain of said first variable gain amplifier.

11. The electronic circuit of claim 9, wherein said first gain control block provides an output to limit the output of said first variable gain amplifier to avoid clipping.

12. The electronic circuit of claim 9, wherein said second gain control bock forms said at least one gain control signal provided to said selector from said filtered signal, as amplified by said second variable gain amplifier.

13. The electronic circuit of claim 9, wherein said second gain control bock, forms said at least one gain control signal provided to said selector from said filtered signal, prior to amplification by said second variable gain amplifier.

14. A method of processing an input signal comprising:
amplifying said input signal by a first variable gain amplifier to provide a first amplified signal;
filtering said first amplified signal by a filter to provide a filtered signal;
amplifying said filtered signal by a second variable gain amplifier to provide an output signal;
forming a gain control signal for said second variable gain amplifier, based on an output of said second variable gain amplifier, to provide a gain limited output signal from said second variable gain amplifier;
forming a bounding control signal from a signal containing information in said input signal, removed by said filter;
forming a first amplifier gain control signal to control gain of said first variable gain amplifier, by limiting a gain control signal formed from an output of said second variable gain amplifier in dependence on a value of said bounding control signal, to avoid clipping of said first amplifier.

15. The method of claim 14, wherein said forming a bounding control signal comprises forming a gain control signal based on an output of said first variable gain amplifier.

16. The method of claim 14, wherein said forming a bounding signal comprises selecting said first amplifier gain control signal, from a gain control signal formed from said filtered signal and a gain control signal formed from said first amplified signal.

17. The method of claim 16, wherein said selecting comprises selecting the lesser of said gain control signal formed from said filtered signal and said gain control signal formed from said first amplified signal.

18. The method of claim 16, further comprising forming a second bounding control signal from a further signal containing information in said input signal, removed by said filter and wherein said forming said first amplifier gain control signal to control gain of said first variable gain amplifier, is further bounded by said second bounding control signal.

19. An electronic circuit comprising:
a plurality of cascaded filters, the first of said plurality of cascaded filters receiving a first amplified signal, and each subsequent one of said plurality of cascaded filters receiving an output of an immediately previous one of said plurality of cascaded filters;
a variable gain amplifier interposed between an output of each of said cascaded filters and an input of a subsequent one of said plurality of cascaded filters;
a gain control block and a bounding block, each associated with each one of said variable gain amplifiers, the gain control block to provide a gain control signal derived from an output of a downstream one of the plurality of cascaded filters to control the gain of the associated variable gain amplifier, and each bounding block for receiving the gain control signal from its associated gain control block and an upstream gain control signal generated upstream of the downstream one of the plurality of cascaded filters, for generating therefrom a bounded gain control signal to control gain of its associated variable gain amplifier, by limiting the gain control signal from its associated gain control block in dependence on the upstream gain control signal.

20. A non-transitory computer readable medium storing hardware descriptor language that may be processed to form the electronic circuit of claim 1.

21. An electronic circuit comprising:
a first variable gain amplifier, for amplifying a signal at an input to provide a first amplified signal;
a first gain control block to provide a gain control signal derived from said first amplified signal
a filter receiving said first amplified signal, to provide a filtered signal;
a second variable gain amplifier, for receiving and amplifying said filtered signal;
a second gain control bock, to provide at least one gain control signal derived from said filtered signal, one of said at least one gain control signal to control the gain of said second variable gain amplifier; and
a bounding block for receiving one of said at least one gain control signal from said second gain control block, and for generating therefrom a bounded gain control signal to control gain of said first variable gain amplifier, wherein said bounding block forms said bounded gain control as the lesser of said at least one gain control signal derived from said filtered signal and said gain control signal from said first gain control block.

22. A method of processing an input signal comprising:
amplifying said input signal by a first variable gain amplifier to provide a first amplified signal;
filtering said first amplified signal by a filter to provide a filtered signal;
amplifying said filtered signal by a second variable gain amplifier to provide an output signal;
forming a gain control signal for said second variable gain amplifier, based on an output of said second variable gain amplifier, to provide a gain limited output signal from said second variable gain amplifier;
forming a bounding control signal from a signal containing information in said input signal, removed by said filter;
forming a first amplifier gain control signal to control gain of said first variable gain amplifier by selecting said first amplifier gain control signal from a gain control signal formed from an output of said second variable gain amplifier and said bounding control signal.

* * * * *